United States Patent [19]

Auston et al.

[11] 4,234,356

[45] Nov. 18, 1980

[54] DUAL WAVELENGTH OPTICAL ANNEALING OF MATERIALS

[75] Inventors: David H. Auston, Mountainside; Jene A. Golovchenko, Basking Ridge; Thirumalai N. C. Venkatesan, Highland Park, all of N.J.

[73] Assignee: Bell Telephone Laboratories, Incorporated, Murray Hill, N.J.

[21] Appl. No.: 44,663

[22] Filed: Jun. 1, 1979

Related U.S. Application Data

[63] Continuation of Ser. No. 964,193, Nov. 28, 1978, abandoned.

[51] Int. Cl.$^2$ .......................................... H01L 21/263
[52] U.S. Cl. ..................... 148/1.5; 148/175; 219/121 L; 250/492 A; 357/91
[58] Field of Search ............................. 148/1.5, 175; 250/492 A; 357/91; 219/121 L

[56] References Cited

U.S. PATENT DOCUMENTS

| | | | |
|---|---|---|---|
| 3,940,289 | 2/1976 | Marquardt et al. | 148/1.5 |
| 4,059,461 | 11/1977 | Fan et al. | 148/1.5 |
| 4,133,702 | 1/1979 | Krimmel | 148/1.5 |
| 4,155,779 | 5/1979 | Auston et al. | 148/1.5 |

OTHER PUBLICATIONS

Chen et al., "Multimode . . . Waveguides . . . Laser Heating" Appl. Phys. Letts. 29 (1976) 657.
Von Gutfeld, "The Extent of Crystallization . . . Optical Pulses . . . " Appl. Phys. Lett. 22 (1973) 257.
TSU et al., "Order-Disorder Transition . . . Laser Irradiation" Phys. Rev. Letts. 42 (May 1979) 1356.
Kachurin et al., "Annealing . . . Laser Radiation Pulses" Sov. Phys. Semicond. 9 (1976) 946.
Kachurin et al., "Annealing . . . Laser Beam" Sov. Phys. Semicond. 10 (1976) 1128.
Battaglin et al., " . . . Laser Annealing Si" Phys. Stat. Solidi. 49A (1978) 347.
Vitali et al., "Surface Structure . . . Laser . . . in Si" Phys. Letts. 63A (1977 351.
Foti et al., ". . . Laser Annealing . . . Self-Implanted Si" Appl. Phys. 15 (Apr. 1978) 365.
Geiler et al., " . . . Laser Induced Diffusion . . . " Phys. Stat. Solidi. 41(q) (1977) K-171.
Bolotov et al., ". . . Laser Annealing . . . " Sov. Phys. Semicond. 10 (1976) 338.
Krynicki et al., "Laser . . . Implanted Si" Phys. Letts. 61A (1977) 181.
Kutukova et al., "Laser Annealing of Implanted Si" Sov. Phys. Semicond. 10 (1976) 265.
Young et al., "Laser Annealing . . . B–Implanted Si" Appl. Phys. Letts. 32 (Feb. 1978) 139.
Klimenko et al., " . . . AR–Laser Radiation of Si" Sov. Jour. Quant. Electronics, 5 (1976) 1289.
Shtyrkov et al., "Local Laser Annealing . . . " Sov. Phys. Semicond. 9 (1976) 1309.
Campisano et al., "Laser Reordering . . . " Solid St. Electronics, 21 (Feb. 1978) 485.
Kular, "Post Laser Annealing . . . GaAs" Electronics Letts. 14 (Feb. 1978) 85.

*Primary Examiner*—L. Dewayne Rutledge
*Assistant Examiner*—Upendra Roy
*Attorney, Agent, or Firm*—Samuel H. Dworetsky; Peter V. D. Wilde

[57] ABSTRACT

A new mode of optical annealing is disclosed wherein two different wavelength pulses are used to anneal a damaged semiconductor substrate. The first pulse may be of relatively weak intensity, but is strongly absorbed by the solid substrate. The second pulse, which is not strongly absorbed by the solid substrate when in the solid phase, is strongly absorbed by the substrate when in the molten phase. Exposure to the first pulse results in the melting of the substrate, which then becomes highly absorptive to light at the wavelength of the second pulse. Readily available laser sources which are generally not highly absorbed by the semiconductor in the solid phase may thus be efficiently utilized.

19 Claims, 8 Drawing Figures

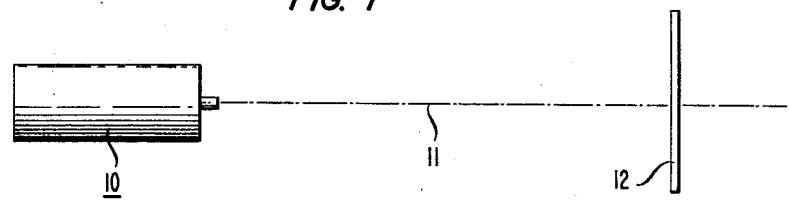
FIG. 1
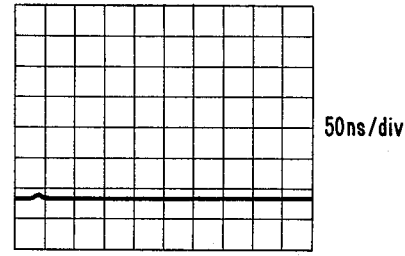
FIG. 2    3.5 J/cm² 1060nm    50ns/div
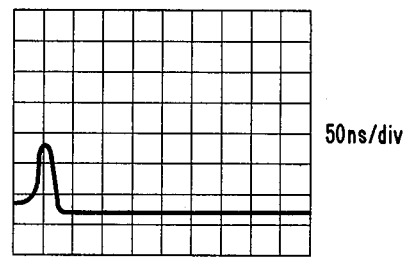
FIG. 3    0.3 J/cm² 530nm    50ns/div
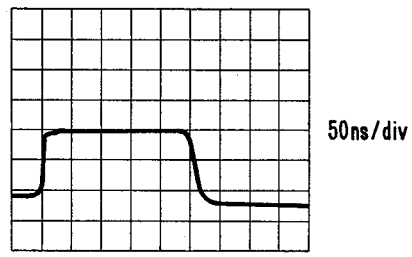
FIG. 4    3.5 J/cm² 1060nm + 0.3 J/cm² 530nm    50ns/div

DUAL WAVELENGTH OPTICAL ANNEALING OF MATERIALS

This is a continuation of application Ser. No. 964,193, filed Nov. 28, 1978, now abandoned.

BACKGROUND OF THE INVENTION

1. Field of the Invention

This invention involves optical annealing of damaged material.

2. Description of the Prior Art

The electrical properties of semiconductor materials are engineered to fulfill specific electrical requirements by doping the pure starting material with appropriate constituents which alter the conduction properties of the semiconductor. Such doping constituents are added to the starting semiconductor primarily by either the diffusion or the ion implantation process. These processes, especially the ion implantation process, may result in significant damage to the crystal structure of the semiconductor. Such damage renders the resultant material ineffective as an active element for most electrical applications.

In present day fabrication processes, the damage incurred during the doping step is repaired or "annealed" by bringing the material to an elevated temperature. The increased mobility and diffusion characteristics at these elevated temperatures allows both the host and the dopant constituents to reorient themselves so that a more perfect crystal structure results with concomitant electrical properties that render the devices electrically operative. Prior art annealing techniques have involved the simple use of an appropriate oven to raise the damaged material's temperature as required.

Recently, the laser has been effectively applied to this annealing process. Exposure of the damaged semiconductor to laser radiation results in increased mobility and diffusion rates necessary for effective annealing. However, unlike the prior art thermal annealing process, two specific and identifiably distinct regimes are found to occur in the laser annealing process. In the first regime, the temperature of the substrate is elevated in a manner similar to the prior art thermal process. As in the prior art process, the semiconductor retains its solid phase throughout this "solid phase epitaxial regrowth" regime.

A second laser annealing regime, without comparable precedent in the prior art annealing process, involves operating under parameters which result in the melting of that part of the substrate which is exposed to the laser. The diffusion rates and mobility in the molten phase are significantly different from that in the solid phase and, as a result, this annealing regime has radically different physical and temporal characteristics than the prior art process. When the substrate is no longer exposed to the laser energy, the molten region refreezes to a crystal, using that part of the underlying undamaged crystalline semiconductor material which is not melted as a template or seed from which to regrow. The process is consequently referred to as "liquid phase epitaxial regrowth" annealing.

The high powers which are necessary for laser annealing are currently most readily available in devices which emit radiation in the infrared region of the spectrum. However, most semiconductors are only weakly absorptive in this region of the spectrum, and hence, laser annealing with infrared sources is found to be inefficient, if at all possible, with such sources. On the other hand, while most semiconductors are found to absorb visible light effectively, currently available laser sources in this region of the spectrum have only limited power and are consequently inefficient for commercial laser annealing applications.

SUMMARY OF THE INVENTION

This invention is an improved technique for optical annealing of damaged materials, such as semiconductors. The technique involves exposing the exemplary semiconductor to a first pulse, usually of relatively low intensity light, which is strongly absorbed by the substrate. This initial exposure results in the melting of at least a thin surface layer of the substrate. This molten layer is then exposed to light which would not normally be strongly absorbed by the semiconductor when in the solid phase, but which is strongly absorbed by the semiconductor when in this molten phase. As a result of this invention, the practitioner may make effective use of those sources which emit light that would be relatively ineffective in annealing the semiconductor when in the solid phase. At the same time, only minimal energy is required from those light sources which are highly absorptive by the solid semiconductor. The invention makes optimal use of these distinct sources in those specific operative regimes where they are most highly and uniquely effective. In a specific embodiment, a single wavelength laser is used in conjunction with a frequency altering device, such as a frequency doubler, to yield two different wavelength portions.

BRIEF DESCRIPTION OF THE DRAWING

FIG. 1 is a schematic representation of an apparatus useful in the practice of this invention.

FIGS. 2-4 schematically represent reflectivity data which demonstrate the particular efficacy of the dual wavelength laser annealing process.

DETAILED DESCRIPTION

Figure 5:
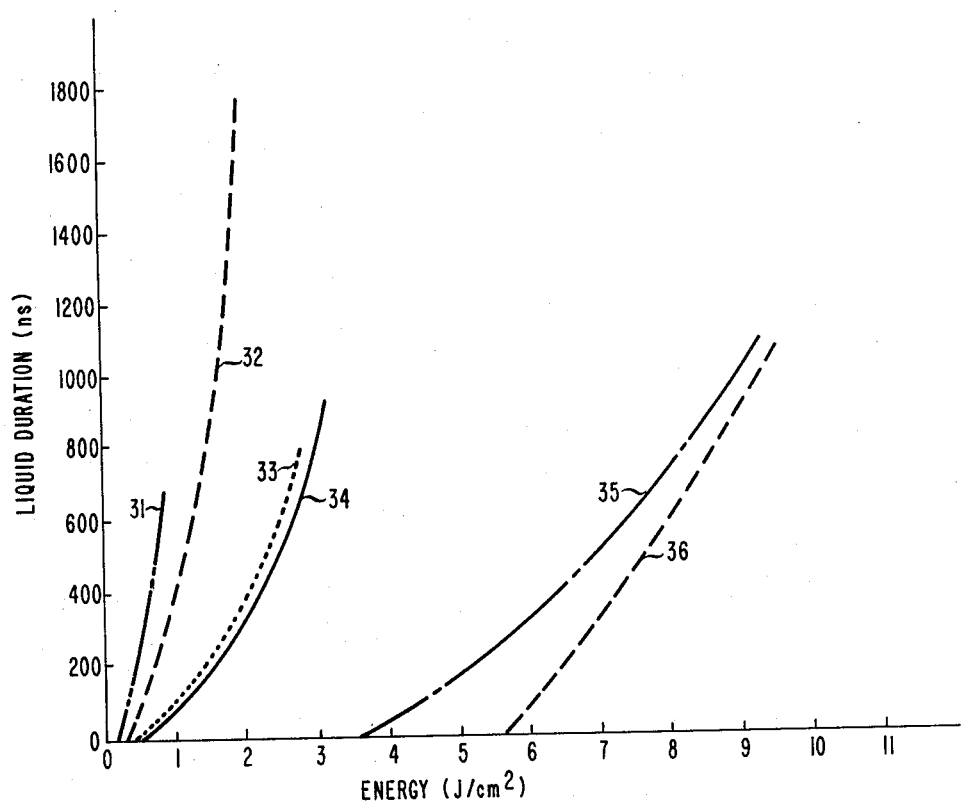
FIGS. 5-6 are plots of the melting properties of various semiconductors as a function of energy of the impinging light for various wavelengths.

The invention is an improved technique for optically annealing damaged materials, e.g., semiconductors. The invention stems partly from the realization that the optical absorption characteristics of materials depend significantly upon whether the material is in the molten or solid phase. Readily available and high-powered infrared sources are not generally effectively absorbed by the exemplary materials in the solid phase. On the other hand, low-powered visible sources are effectively absorbed by the solid phase semiconductor. The invention involves utilizing a pulse of light which is strongly absorbed by the materials to render at least the surface of the material molten. Another pulse of light, in a region of the spectrum which is not strongly absorbed by the material in the solid phase, but which is strongly absorbed by the molten phase, is then used to yield effective annealing.

The required thickness of the molten region which is created by exposure to the first pulse is dictated by the absorptive phenomenon which takes place during exposure to the second pulse. The physical characteristics of the molten phase absorption are such that the molten region created by the first pulse will usually have a thickness approximately equal to the optical skin depth of the material at the wavelength of the second pulse. In many applications, this molten regime will display properties commonly referred to as "metallic." However, this invention is concerned primarily with the optical absorptive properties of the molten regime and is less concerned with some of the other properties associated with metallic materials.

FIG. 1 is a schematic representation of an apparatus which may be used in the practice of this invention. In this figure, 11, is a beam of light emitted by a source, 10, and 12 is the damaged substrate. The light source 10 produces the two wavelengths of light necessary for the practice of this invention and directs them with appropriate timing characteristics to the substrate 12. The source 10 may simply be two standard light sources of sufficient power and possibly with appropriate filters, or two lasers of appropriate wavelengths. In a specific embodiment, the source is a single laser with an appropriate frequency doubling crystal.

The various parameters involved in laser annealing may be effectively monitored by utilizing the reflectivity technique disclosed in a commonly assigned application, Ser. No. 935,665. In this technique, the molten phase is monitored by observing appropriately reflected light. The technique depends on the increased reflectivity of the semiconductor when in the molten phase. The data in FIGS. 2-4 was obtained using that technique. The figure represents the reslts of an experiment involving laser annealing of a silicon substrate implanted with arsenic atoms. FIG. 2 displays the reflectivity of a substrate exposed to a 3.5 joules per $cm^2$ pulse of 1060 nanometer radiation. In the figure, the vertical axis indicates the reflectivity of the semiconductor surface exposed to the laser light. The horizontal axis represents time. It is apparent from FIG. 2, that for silicon, the 1060 nm light is not strongly absorbed. The lack of reflected light from the substrate, as indicated by the essentially horizontal nature of the data, shows that no melting of the semiconductor took place. In FIG. 3, an identically prepared substrate was exposed to a pulse of 530 nm light at an energy density of 300 mj per $cm^2$. In this figure, it is apparent that the substrate surface has been melted, as shown by the enhanced reflectivity of the substrate surface. While the absorption characteristics of the substrate increases radically from 1060 to 530 nm, yielding the observed molten phase, in this case the energy available from the source at 530 nm was not adequate to melt the substrate to sufficient depths so as to reach the underlying single crystal material. Consequently, the processed material is not single crystal and is not adequately annealed. FIG. 4 illustrates the results when an identical substrate is exposed to a pulse of 1060 nm light and 530 nm light with energies as in FIGS. 2 and 3. In this example, the semiconductor is not only rendered molten, but remains molten for a much longer period than that obtained in FIG. 3. This synergistic effect results since the material rendered molten by the 530 nm light becomes highly absorptive to the high-powered 1060 nm light to which it was previously essentially transparent. Essentially, the full power of the 1060 nm light is then absorbed by the molten region extending the depth of this region further so that part of the single crystal undamaged material underlying the damaged layer is also rendered molten. As a result, when the laser is shut off, and the molten material recrystalizes, the single crystal underlying region acts as a seed or template from which the molten regime may regrow in single crystal form.

It may be seen from the above discussion that the absorptive characteristics of the semiconductor at various wavelengths is a critical aspect of this invention. The invention may be effectively practiced as long as the solid semiconductor is sufficiently absorptive at the wavelength of the first light pulse so that a melt results. This pulse will consequently be referred to as the "melt initiating pulse."

It should be noted that there may be various regions of the spectrum for which the solid semiconductor is absorbing. In general, visible light is absorbed strongly by most semiconductors as a result of prevalent electronic transitions. However, strongly coupled absorption by the solid semiconductor may also occur in the far infrared region of the spectrum as a result, for example, of vibrational excitation. In such a case, the wavelength of the "melt initiating pulse" may be in the far infrared region of the spectrum.

Once the surface layer of the semiconductor has been rendered molten, the second pulse can couple with this molten region which is highly absorbent to its light. Light from this second pulse, since it is now readily absorbed will generally extend the melt to greater depths. This pulse is consequently referred to as the "drive in" pulse.

Generally, there are more regions of the spectrum which are absorbed by the molten phase than are absorbed by the solid phase. However, certain regions of the spectrum may be more conveniently utilized because of readily available high-powered sources. Such sources may not emit light which is strongly absorbed by the solid phase, and hence would couple energy into the semiconductor with much less efficiency prior to this invention. However, with the techniques of this invention, the practitioner will first render the semiconductor molten, by means of the melt initiating pulse, thereby allowing the subsequent drive in pulse to couple effectively to the substrate.

Figure 6:
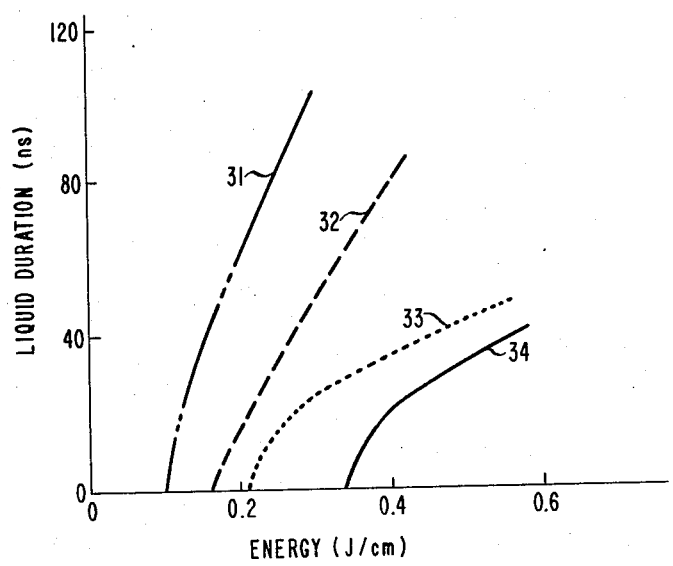

The physical characteristics of both the melt initiating and drive in pulses are determined by the requirement that exposed portions of the semiconductor be rendered molten to a depth sufficient to include some of the underlying single crystal meterial. This requirement governs the temporal and energetic characteristics of the pulses, as well as their wavelength. These characteristics are displayed in part in FIGS. 5 and 6 where the energy of a 40 nanosecond pulse is plotted on the horizontal axis, and the duration of the resultant molten phase is plotted on the vertical axis. Curve 31 is for a gallium arsenide substrate and laser light of 530 nm. Curve 32 is for a germanium substrate and a wavelength of 530 nm. Curve 33 is for a silicon substrate exposed to 530 nm light. Curve 34 is for a silicon substrate implanted with 30 kV arsenic atoms to a density of $10^{15}$ atoms per square centimeter and exposed to 530 nm light. Curve 35 represents a silicon substrate exposed to 1060 nm light. Curve 36 represents silicon implanted with 30 kV arsenic atoms to $10^{15}$ atoms per square centimeter and exposed to 1060 nm light. It is clear from this figure that the shorter wavelength light is much more readily absorbed by the crystal than the longer wavelength light. Consequently, for this shorter wavelength light, longer melt durations are obtained with lower energy deposition. While molten conditions may be obtained using the long wavelength light, the figure shows the inefficiency of such a process when compared to the use of the shorter wavelength light to initiate the molten phase. Additionally, it should be noted that the efficiency of the longer wavelength light in rendering the crystal molten is highly dependent upon implant dose. In contradistinction to this, the efficiency of the shorter wavelength light in rendering the crystal molten is much less dependent on implant dosage. Once the crystal is rendered molten, it becomes highly absorptive over a broad range of the spectrum with an absorptivity which is essentially independent of implant dosage.

The temporal extent of the laser pulses is determined by the requirement that the substrater be rendered molten. As such, both the absorptivity of the material and its thermal diffusion must be considered in determining the optimum length of the pulse. The absorption of light by the material must be sufficiently rapid so that the heat will not be lost as a result of the thermal diffusion. Hence, the absorptivity must be high enough relative to the thermal diffusivity so that melting will occur. In the experiments performed by applicants, 5-100 ns pulses were found to be most efficient. However, the pulse width will be materially dependent on the nature of the material, its physical characteristics and the wavelength of the light. In many applications, the pulse width will be less than 150 ns and in most applications, the pulse width will be less than 1 microsecond. These considerations are equally important for both the melt initiating pulse and the drive in pulse.

The time delay between the first and second pulses may be critical. For example, if the second drive in pulse arrives after the first melt-initiating pulse has been extinguished, the molten region may have refrozen and the drive in pulse may be totally ineffective. Likewise, if the drive in pulse arrives prior to the melt-initiating pulse, that portion of it which appears before the arrival of the melt-initiating pulse will be ineffective. The most efficient operation occurs when the melt-initiating pulse arrives just before the drive in pulse and overlaps with it. Hence, the nomenclature used herein referring to the pulses as the first pulse and the second pulse, does not refer to the temporal relationship between the pulses, but refers rather to the functional effect of the pulses. The first melt-initiating pulse renders the surface molten and the drive in pulse strongly couples with this molten region. However, as discussed below with reference to FIG. 4, in some embodiments, the "second" pulse may arrive before the "first" pulse.

The depth to which effective annealing can proceed is in part determined by thermal diffusion considerations in the melt. The thicker the molten region, the greater distance over which the heat must diffuse to extend the molten region. For depths greater than one micron, the boundary conditions on the necessary thermal gradient are such that the surface, which is the hottest, will begin to display physical damage. The embodiment of FIG. 8, as discussed below, is then particularly advantageous, since in that embodiment the drive in pulse irradiates the substrate from the opposite side of the melt-initiating pulse. In this configuration, the heat is absorbed at the melt-solid interface and need not diffuse by means of a thermal gradient. Hence, greater depths may possibly be rendered molten without surface damage.

The pulses required for the effective practice of this invention may be obtained from any practical device available to the practitioner. They may originate in two separate laser sources. However, a most effective way of practicing this invention is through the utilization of a single laser which emits light at the wavelength of one of the pulses, and then transformation of a part of this pulse, in a non-linear device, into light at the wavelength required for the other pulse. In a specific embodiment, an Nd-glass laser emitting light at 1060 nm may be partly frequency-doubled to yeild light at 530 nm. In this specific embodiment, the 530 nm pulse comprises the first melt initiating pulse, while the 1060 pulse comprises the second drive in pulse. In other embodiments, the laser source may emit light which comprises the first pulse, and the non-linear processing may yield light which comprises the second pulse. The light pulses may be polarized or unpolarized and may be co-linear or may impinge on the substrate from different angles of incidence.

The substrate which is processed according to the teachings of this invention, is usually a doped semiconductor material. As discussed above, the doping process may involve any one of the prevalent semiconductor doping processes. A portion of the semiconductor material which is damaged is then exposed to the annealing process so as to anneal the damage and render the semiconductor electrically active. Underlying the damaged region is a substantially perfect single crystal material to which the molten region must extend in order for effective annealing to occur. Usually, the single crystal material will be identical to the original starting semiconductor material before it was damaged. For example, the starting material may be a single crystal silicon wafer which is damaged to some depth during ion implantation. The underlying base silicon remains single crystal and it is this material which provides the seed for regrowth during the annealing process. However, in some embodiments, the underlying single crystal material may not be exactly identical to the damaged material, but may be sufficiently analogous to its desired structure so that it may effectively act as a seed for regrowth. For example, a sapphire substrate will act as an effective seed so that overlaying silicon may be laser annealed according to the teachings of this invention.

While many embodiments will involve the annealing of implanted semiconductor material, in some embodiments, the "damaged" material will merely be a deposited layer. For example, silicon may be deposited on a thin single crystal substrate using, for example, an evaporative process. The deposited silicon is then totally amorphous, but may be rendered crystalline by the annealing process described above. The instant invention is broad enough to encompass such processing and the term "damaged" semiconductor as it is used in this specification, is intended to be broad enough to encompass such deposited material, or any other material, such as a surface layer of dopant, which is either amorphous or lacks perfect crystal structure. Exemplary semiconductor materials include silicon, germanium and gallium arsenide.

While the effects of the annealing process on impurity distribution have not been discussed, they may be significant, and may be advantageously utilized. In some situations, the impurity may be implanted near the surface and upon melting, may diffuse throughout a significant portion of the depth of the molten region. As a result, the drive in pulse which is used to increase the depth of the molten region may also be used to increase the depth to which the implanted impurities diffuse.

Figure 7:
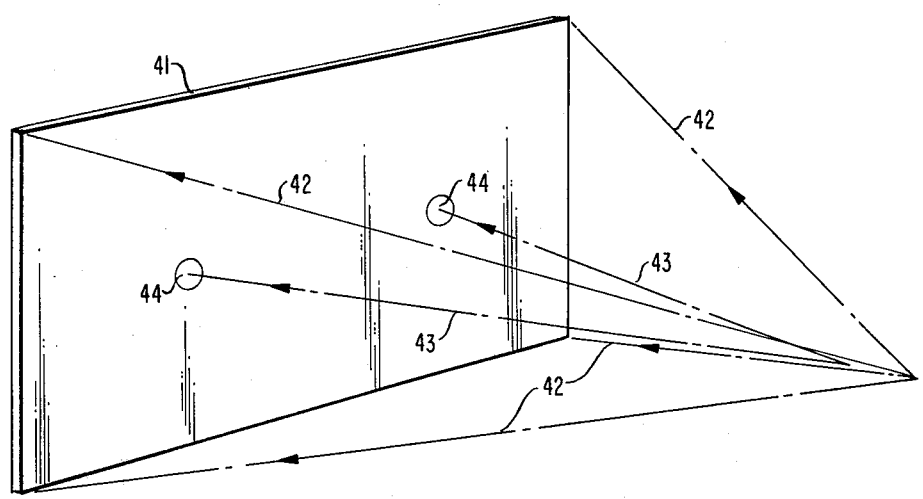
FIGS. 7 and 8 are schematic representations of specific embodiments of the invention.

The nature of the second pulse, specifically the fact that it is not strongly absorbed by the solid phase material, allows one to practice this invention in a number of specific configurations which permit more convenient laser annealing than heretofore possible. For example, FIG. 7 shows a piece of semiconductor material 41 which the practitioner desires to anneal. According to the dictates of this invention, and specifically according to the dictates of this embodiment, the entire substrate is exposed to drive in light 42. Because of the nature of this light, and the fact that it is not absorbed by the solid phase, the light has little effect on the substrate. However, portions of the substrate are additionally exposed to melt-initiating light 43. Those regions of the substrate which are exposed to the melt-initiating light, identified as 44, are rendered molten, and are thereby made capable of absorbing the drive in light, 42. Upon absorption of this light, the regions 44 are effectively annealed. This particular configuration allows one to use the melt-initiating pulses to define specific regions which are annealed, while the entire substrate is exposed to the drive in light.

Figure 8:
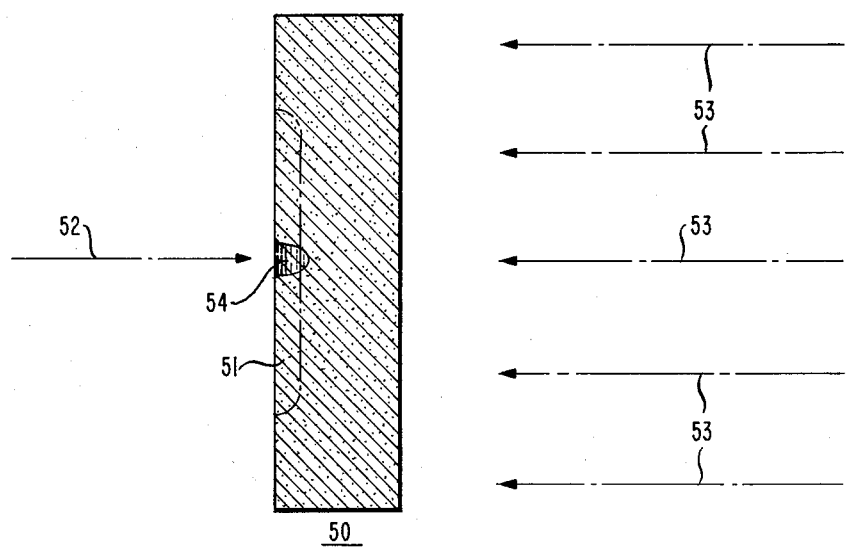

In another embodiment, shown in FIG. 8, a substrate, 50, with a damaged region, 51, is exposed to drive in light, 53, from its far side. It should be noted that in this embodiment, the practitioner is taking advantage of the fact that this substrate in its solid phase is transparent to the drive in light. The damaged region, 51, is exposed on its near side to melt-initiating light, 52. Those regions of the substrate which are exposed to the melt-initiating light, and identified as 54 will then be rendered absorptive to the molten phase light and will be annealed.

As discussed above, this embodiment is particularly advantageous since the thermal energy is deposited by the drive in pulse at the melt solid interface and need not be diffused from the surface to this interface by means of a thermal gradient. Consequently, physical damage which is observed in the previous embodiments when the molten region becomes too thick is not observed in this embodiment.

EXAMPLE

An arsenic doped silicon wafer was annealed using the above-described process. The silicon wafer was three inches in diameter and was ion implanted with 30 kV arsenic atoms to a depth of 300 angstroms and a density of $10^{15}$ arsenic atoms per square centimeter. Subsequent to implantation, the 500 Angstrom damaged layer was annealed by exposing the surface to a frequency-doubled Nd-glass laser. The laser apparatus included a Q-switched Nd-glass laser, a Nd-glass single pass amplifier, and a KDP crystal frequency doubler. The system emitted 3.5 joules per $cm^2$ 1060 nm light and 0.3 joules per $cm^2$ frequency doubled 530 nm light. The infrared light beam was 8 millimeters in diameter and the associated pulse had a 40 ns full width at half maximum, while the visible light had a 6 millimeter diameter with a 30 ns full width at half maximum. The pulses were co-linear and were impinged on the wafer at a 10 degree angle to prevent reflection of the light into the laser. Reflection studies from the silicon surface indicate that the molten phase existed for approximately 260 ns and extended approximately 2500 angstroms. The damaged region which was exposed to light was effectively annealed as determined by subsequent Rutherford back scattering and channeling studies.

We claim:

1. A process for annealing damaged material comprising exposing a damaged layer, overlying a single crystal material, to light thereby rendering the damaged region and at least a portion of the underlying material molten, and thereby annealing the damaged layer, the invention characterized in that the light comprises two portions, of different wavelengths, a first melt-initiating portion, which is absorbed by the solid layer rendering at least a portion of it molten, and a second drive in portion which extends the molten region to at least the depth of the single crystal material.

2. The method of claim 1 wherein one portion of the light is laser light.

3. The method of claim 2 wherein the material is a semiconductor.

4. The method of claim 3 wherein the substrate material is selected from the group consisting of silicon, germanium and gallium arsenide.

5. The method of claim 1 wherein a surface layer of the material has been damaged by ion implantation.

6. The method of claim 5 wherein the damaged region extends to a depth less than one micron.

7. The method of claim 1 or 6 wherein the light is pulsed and the pulses are less than one microsecond.

8. The method of claim 7 wherein the width of pulses are less than 150 nanoseconds.

9. The method of claim 7 wherein the melt-initiating pulse irradiates the material first, and overlaps temporally with the drive in pulse.

10. The method of claim 7 wherein the drive in pulse irradiates the material first, and overlaps temporally with the melt-initiating pulse.

11. The method of claim 10 wherein the spatial extent of the drive in pulse is greater than that of the melt-in pulse.

12. The method of claim 11 wherein the melt-initiating pulse is used to write an annealed pattern on the material.

13. The method of claim 1 wherein damaged semiconductor materail comprises a deposited layer of material.

14. The method of claim 13 wherein the deposited material is evaporated.

15. The method of claim 14 wherein the evaporated material is amorphous.

16. The method of claim 15 wherein the underlying single crystal material is different than the damaged material.

17. The method of claim 6 wherein a single wavelength source is used, a portion of whose output is transformed to light of a different wavelength, thereby forming two wavelength portions.

18. The method of claim 6 wherein the melt initiating pulse irradiates the damaged semiconductor layer from its surface, and the drive in pulse irradiates the damaged semiconductor layer from its underside.

19. A process comprising heating at least a portion of a body in which said portion is exposed to processing light of a given spectral distribution characterized in that the said portion is at least initially exposed to initiating light of a differing spectral distribution, the said portion having a greater absorption cross-section for the said initiating light in accordance with which absorption of the said initiating light results in increasing the absorption cross-section of the said portion for the said processing light.

* * * * *